United States Patent [19]
Johnson

[11] 4,124,860
[45] Nov. 7, 1978

[54] OPTICAL COUPLER
[75] Inventor: Herman D. Johnson, Dallas, Tex.
[73] Assignee: Optron, Inc., Carrollton, Tex.
[21] Appl. No.: 669,105
[22] Filed: Mar. 22, 1976

Related U.S. Application Data
[63] Continuation of Ser. No. 553,530, Feb. 27, 1975, abandoned.
[51] Int. Cl.$^2$ ............................................. H01L 31/12
[52] U.S. Cl. ........................................ 357/19; 357/47; 357/49; 357/4; 250/551
[58] Field of Search .................... 357/19, 49, 47, 4; 250/551

[56] References Cited
U.S. PATENT DOCUMENTS

| | | | |
|---|---|---|---|
| 3,304,431 | 2/1967 | Biard | 250/217 |
| 3,315,176 | 4/1967 | Biard | 330/59 |
| 3,393,088 | 7/1968 | Manasevit | 117/106 |
| 3,414,434 | 12/1968 | Manasevit | 117/201 |
| 3,480,783 | 11/1969 | Mankarinis | 250/211 |
| 3,628,039 | 12/1971 | Ochs | 250/239 |
| 3,639,770 | 2/1972 | Zizelman | 250/218 |

Primary Examiner—Martin H. Edlow
Attorney, Agent, or Firm—Jack A. Kanz

[57] ABSTRACT

Disclosed is apparatus for effecting optical coupling between at least one photo-emissive device and at least one photo-sensitive device while maintaining electrical isolation between the devices. The light-emitting chip and the photo-sensitive chip are mounted on an electrically insulating substrate or substrates with their major faces in substantially the same plane and facing the same direction. The insulating substrate is mounted on a conventional header and leads attached to each of the active regions by conventional methods. The light emitter and sensor are then encapsulated in a single hemispherical dome of electrically insulating material which is substantially transparent to the operative wavelengths of the electro-optical devices. Optical coupling is accomplished by direct coupling between the edges of the chips and by internal reflection from the surface of the dome.

15 Claims, 2 Drawing Figures

OPTICAL COUPLER

This is a continuation of application Ser. No. 553,530 filed Feb. 27, 1975 now abandoned.

This invention relates to optically coupled electronic devices. More particularly, it relates to photo-emissive and photo-responsive devices mounted in the same package and optically coupled through an electrically insulating encapsulating material substantially transparent to the operative wavelengths of the optical devices.

Optical couplers of various designs are conventionally used in many applications. Generally such couplers are used to transfer signals from one circuit to another circuit where complete electrical isolation between the respective circuits is desired. Conventionally such couplers employ a solid state photo-emissive device, such as a light emitting diode or the like, which, when properly biased, emits photon energy, and a solid state photo-responsive device, such as a phototransistor, a photo-voltaic diode or the like, which is responsive to the optical wavelengths emitted by the source. The source and sensor chips are conventionally mounted in the same encapsulation apparatus. However, the encapsulation apparatus is usually specially designed for such purposes and is generally a cylindrical device with the chips mounted at or near opposite ends thereof and disposed with their major faces parallel and opposed so that a majority of the light emitted by the source is directed toward the major face of the sensor. The space between the chips is often filled with an epoxy or other material which is substantially transparent to the operative wavelengths of the sensor and emitter.

By placing the emitter and sensor in substantially parallel planes with the major faces opposed and with a minimum of space therebetween, maximum optical coupling can be accomplished while maintaining electrical isolation between the semiconductor chips. Unfortunately, assembly of such couplers is quite difficult since special and complex assembly techniques are required. Furthermore, specially designed and fabricated chips must usually be used for both the emitter and the sensor. The semiconductor chips must first be mounted on special mounting substrates which are then secured in the desired positions in the special header. Attaching leads to each of the respective chips is also complicated by their unique placement in the header.

Many of the above-described difficulties are avoided by the present invention. Briefly, in accordance with the invention discrete emitter and sensor chips are mounted on the same or adjacent non-conductive substrates with their major faces lying in substantially the same plane. The substrate may be mounted on a conventional semiconductor header, such as a standard TO-5 or TO-18 header or the like. The chips are electrically isolated by a minimum lateral spacing therebetween. The chips are then encapsulated in a dome of electrically insulating material which is substantially transparent to the operative wavelengths of the optical devices. Optical coupling is accomplished by internal reflection from the domed surface.

It will be readily appreciated that using the principles of the invention, optical couplers can be fabricated using conventional headers of various design. Furthermore, all leads may be connected after the chips are mounted by conventional techniques. Specially designed chips are not required; therefore conventional sensor and emitter chips may be used. Moreover, a plurality of sensor and/or emitter chips may be mounted in a single header; thereby permitting simultaneous coupling of a single emitter with a plurality of sensors or vice versa. These and other features and advantages of the invention will become more readily understood when taken in connection with the appended claims and attached drawings in which:

Figure 1:
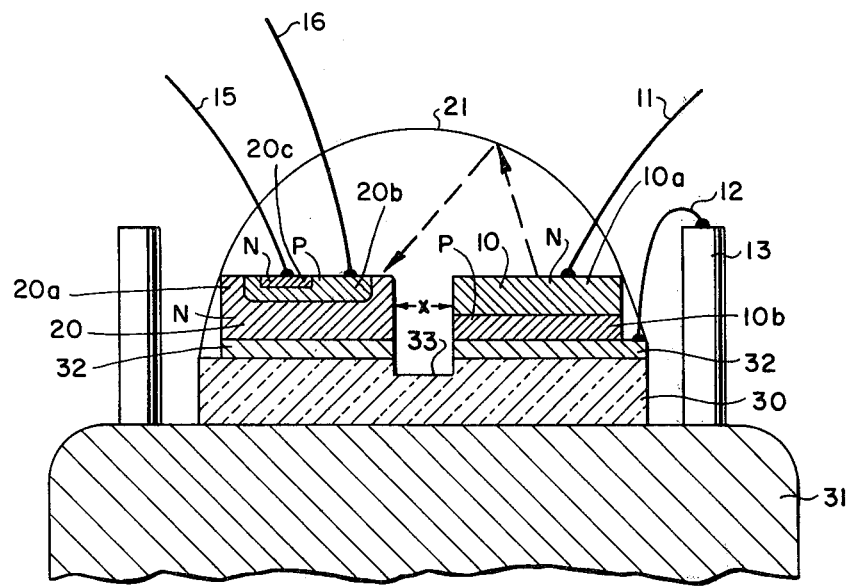
FIG. 1 is a sectional view of the preferred embodiment of the invention.

Although the principles of the invention are equally applicable to various combinations of emitters and sensors, the invention will be described herein with specific reference to a silicon sensor and a gallium arsenide emitter.

As illustrated in the drawings, an optical emitter chip 10 and a sensor chip 20 are mounted on one face of an electrically insulating substrate 30. In the preferred embodiment the substrate 30 is an alumina wafer which is secured to the header 31 by conventional means such as brazing or the like. The chips 10 and 20 are alloyed to the substrate 30 with a conventional preform 32 such as gold or gold alloy.

The chips 10 and 20 are placed as close to each other as is practical while maintaining sufficient separation to assure electrical isolation. In the preferred embodiment, the distance "X" shown in FIG. 1 separating the sensor and emitter is about 0.010 to about 0.020 inch, thereby insuring electrical isolation to about 1.5 to about 2.0 kilovolts d.c. To insure adequate electrical isolation, the surface of the substrate between the chips 10 and 20 may be cut to form a trough 33.

In the embodiment illustrated the emitter chip 10 is a discrete body of gallium aresenide having a region of suitably doped N-type conductivity 10a and a region of suitably doped P-type conductivity 10b defining a P-N junction therebetween. The P-type surface is alloyed to the face of the alumina disc 30 by a gold preform 32. A lead 12 is bonded to the preform 32 and provides electrical communication with the post 13 extending through the header. Likewise, a lead 11 is bonded to the N-type layer to provide ohmic contact between the N-type layer and another post 14. It will thus be observed that the chip 10 and associated leads form a conventional gallium arsenide light emitting diode which, when forward biased, emits photon energy.

Figure 2:
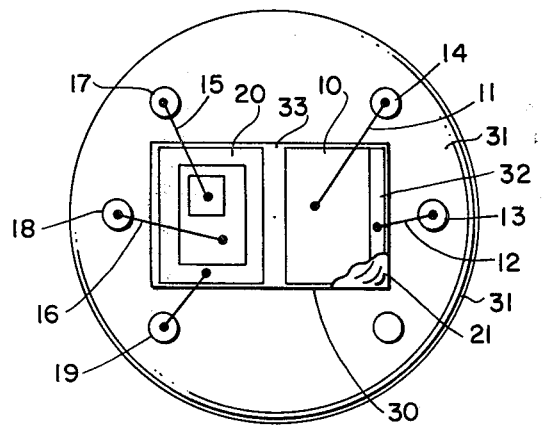
FIG. 2 is a top plan view of the apparatus of FIG. 1.

In the embodiment illustrated the sensor chip 20 is a conventional silicon phototransistor comprised of a body of N-type silicon 20a having a planar diffused P-type base layer 20b and N-type emitter 20c. The chip 20 is bonded to the alumina disc 30 with gold preform 32. Leads 15 and 16 bonded to the emitter and base regions, respectively, provide electrical connections with the emitter post 17 and base post 18, respectively. Likewise, a suitable lead is bonded between the collector region and post 19 as illustrated in FIG. 2.

After the photo-emissive and photo-sensitive devices have been assembled and mounted as described above, a fluid mass of optically transparent material is placed over the entire alumina substrate 30. Because of surface tension of the fluid mass, the optically transparent material contracts to form a hemispherical dome 21 as indicated in FIG. 1 covering all faces of the sensor and emitter except the faces bonded to the substrate 30.

The optically transparent material 21 may be any suitable material which is essentially transparent to the optical wavelengths of the photoemissive and photosensitive devices and which provides the desired electrically insulating characteristics. A clear silicone marketed by the Dow-Corning Company under the designation R 6104 Silicone has been found particularly suitable for formation of the dome. This material is easily applied in a liquid form and forms the dome required by its own surface tension. Furthermore, the material is readily cured by heating at about 150° C. for about two hours to form a hard electrically insulating body which is impervious to air and moisture but readily transmits the optical wavelengths required.

Although the major faces of the sensor chip 20 and emitter chip 10 are in substantially the same plane and facing substantially the same direction, optical coupling therebetween is accomplished by internal reflection of light emitted by the photo-diode. As illustrated in FIG. 1, a ray of light emerging from the top surface of the photoemissive device must strike the silicone-air interface. If the angle at which the ray strikes the interface is less than the critical angle, as determined by the difference in indices of refraction of air and the transparent dome 21, the ray is reflected back toward the sensor. If the angle is greater than the critical angle, the ray escapes from the dome 21. Through such internal reflection, sufficient photon energy is conducted from the photo-emissive to the photo-sensitive device to provide suitable optical coupling therebetween.

It will be readily recognized that light will be emitted from the edges of the emitter chip as well as the top surface. The light emitted from the edge facing the photo-sensitive chip 20 will, of course, be absorbed by the sensor chip and will not be reflected. Some light will naturally escape from the dome 21. However, it has been found that the internal reflection which occurs is more than sufficient to effect suitable optical coupling.

If desired the surface of dome 21 may be coated with a suitable reflective coating to improve the reflection efficiency. Alternatively, the internal surface of the encapsulation cap placed on the header may be coated with a reflective material or suitably shaped to enhance reflection of light impinging on the internal surface thereof.

From the foregoing it will be observed that since the source and sensor chips are mounted on the same or adjacent substrates, conventional chips used for making individual photo-sensitive devices and photo-emissive devices can be used in the apparatus of this invention without variation in design. Accordingly, vast savings in time, materials and manufacturing costs can be realized. Furthermore, conventional mounting and encapsulation headers can be used, thus eliminating the need for specially designed packaging and greatly simplifying assembly.

Although the invention has been described with particular reference to optical coupling between a single light source and a single sensor, it will be appreciated that other combinations of chips may be used. For example, since all chips are mounted facing the same direction, a plurality of sensors, each electrically isolated from the others, may be mounted on the same substrate with a single emitter chip. All the chips are then enclosed under a single dome. Accordingly, light emitted by the emitter chip will be simultaneously absorbed by all the sensors so that multiple circuits may be controlled by a single light source. Furthermore, a plurality of light emitters as well as a plurality of sensors may be enclosed in a single dome, each electrically isolated from the other but optically coupled through the transparent dome. Each sensor is then responsive to the optical output from any of the light emitters; thus providing a multiple input/multiple output apparatus. Similarly, a single sensor may be coupled with a plurality of light sources to provide means for making a single sensor responsive to the output of any of a plurality of inputs.

From the foregoing it will be readily apparent that the principles of the invention may be utilized to form various combinations of multiple and/or single input and output optical couplers using conventional sensor and emitter chips. Little or no special assembly equipment is required and conventional headers may be used. Furthermore, the invention is not limited to the specific encapsulation material described. Various materials which are substantially transparent to the operative wavelengths of the sensors used and which is substantially electrically non-conductive may be used so long as the material can be formed into a substantially hemispherical dome.

While the invention has been described with particular reference to specific embodiments thereof, it is to be understood that the forms of the invention shown and described in detail are to be taken as preferred embodiments of same, and that various changes and modifications may be resorted to without departing from the spirit and scope of the invention as defined by the appended claims.

What is claimed is:

1. An optical coupler comprising
   (a) at least one photo-emissive device comprising a discrete body of semiconductor material having first and second opposed major faces and at least one photo-responsive device comprising a discrete body of semiconductor material having first and second opposed major faces, the first major face of each of said bodies mounted on electrically non-conductive support means supporting the opposed edges of said bodies in close proximity but electrically isolated from each other and the second major face of each of said bodies in a common plane and facing substantially the same direction, and
   (b) a substantially hemispherical dome of electrically non-conductive material substantially transparent to the operative wavelengths of said photo-emissive and photo-responsive devices disposed over and in contact with the second major faces of said devices and covering all surfaces of said devices except said first major faces; whereby light emitted by said photo-emissive device is directed to the second major face of said photo-responsive device by internal reflection from the dome-air interface of said hemispherical dome.

2. An optical coupler as defined in claim 1 wherein said devices are mounted on a wafer of alumina and the lateral spacing between the opposed edges of said devices is from about 0.01 inch to about 0.02 inch.

3. An optical coupler as defined in claim 2 including a trough formed in said wafer of alumina between the opposed edges of said devices.

4. An optical coupler as defined in claim 1 wherein said photoemissive device is a body of semiconductor material including contiguous regions of P-type conductivity and N-type conductivity forming a P-N junction therebetween, at least a portion of said P-N junction being substantially parallel to the top surface of said body, and further including means for forward biasing said P-N junction.

5. An optical coupler as defined in claim 1 wherein said photoemissive device is a light-emitting gallium arsenide diode.

6. An optical coupler as defined in claim 1 wherein said photoresponsive device includes a region of photoconductive material.

7. An optical coupler as defined in claim 1 wherein said photoresponsive device is a photo-voltaic device.

8. An optical coupler as defined in claim 1 wherein said photoresponsive device is a photo-transistor.

9. An optical coupler as defined in claim 1 wherein said photoresponsive device is a silicon photo diode.

10. An optical coupler as defined in claim 1 including a plurality of said photo-responsive devices and only one photo-emissive device.

11. An optical coupler as defined in claim 1 including a plurality of said photo-emissive devices and only one photo-responsive device.

12. An optical coupler as defined in claim 1 including a plurality of said photo-emissive devices and a plurality of said photo-responsive devices.

13. Apparatus for optically coupling electrically isolated electrical circuits comprising:
   (a) first means for generating an optical signal in response to an electrical signal, said first means including a first discrete semiconductor body having first and second substantially parallel major faces, the first major face of said first body mounted on a substantially electrically non-conductive substrate with said first and second major faces substantially parallel to the surface of said substrate,
   (b) second means for generating an electrical signal in response to said optical signal, said second means including a second discrete semiconductor body having first and second substantially parallel major faces, the first major face of said second body mounted on a substantially electrically non-conductive substrate, the second major faces of said first and second bodies lying in substantially the same plane and facing substantially the same direction, and
   (c) a substantially electrically non-conductive medium substantially transparent to said optical signals contacting both said second major faces and forming a substantially hemispherical dome.

14. An optical coupler as defined in claim 1 including reflective means covering said hemispherical dome.

15. An optical coupler as defined in claim 14 wherein said reflective means is a coating of reflective material applied to the surface of said hemispherical dome.

* * * * *

UNITED STATES PATENT OFFICE
CERTIFICATE OF CORRECTION

Patent. No. 4,124,860  Dated November 7, 1978

Inventor(s) Herman D. Johnson

It is certified that error appears in the above-identified patent and that said Letters Patent are hereby corrected as shown below:

On the title page, in the abstract, line 6, "substrateor"

should read -- substrate or --.

Column 3, line 18, "less" should read -- greater --; line 21,

"greater" should read -- less --.

Signed and Sealed this

Twentieth Day of February 1979

[SEAL]

Attest:

RUTH C. MASON
*Attesting Officer*

DONALD W. BANNER
*Commissioner of Patents and Trademarks*